United States Patent
Smith (10) Patent No.: US 9,253,925 B1
(45) Date of Patent: Feb. 2, 2016

(54) PANEL FOR ENHANCING THERMAL CONDUCTION IN AN ELECTRONIC ASSEMBLY

(71) Applicant: L-3 Communications Corp., New York, NY (US)

(72) Inventor: Robert H. Smith, Salt Lake City, UT (US)

(73) Assignee: L-3 Communications Corp., New York, NY (US)

( * ) Notice: Subject to any disclaimer, the term of this patent is extended or adjusted under 35 U.S.C. 154(b) by 287 days.

(21) Appl. No.: 13/739,995

(22) Filed: Jan. 11, 2013

(51) Int. Cl.
*H05K 7/20* (2006.01)
*H02B 1/01* (2006.01)

(52) U.S. Cl.
CPC ............................ *H05K 7/20409* (2013.01)

(58) Field of Classification Search
None
See application file for complete search history.

(56) References Cited

U.S. PATENT DOCUMENTS

| | | | |
|---|---|---|---|
| 7,784,585 B2 | 8/2010 | Greenwood | |
| 8,570,749 B2* | 10/2013 | Tissot | 361/720 |
| 2008/0019102 A1* | 1/2008 | Yurko | 361/719 |
| 2010/0321892 A1 | 12/2010 | Vander Ploeg et al. | |
| 2011/0058336 A1* | 3/2011 | Sundstrom et al. | 361/710 |
| 2012/0206882 A1* | 8/2012 | Mohammed et al. | 361/710 |
| 2013/0050953 A1* | 2/2013 | Sano et al. | 361/720 |

OTHER PUBLICATIONS

ITT Wire Rope Isolators (printed Sep. 4, 2012), 2 pages.

* cited by examiner

*Primary Examiner* — Courtney Smith
(74) *Attorney, Agent, or Firm* — Kirton | McConkie (57) ABSTRACT

An electronic assembly can include a support structure, a circuit substrate coupled to a first portion of the support structure, and a composite material panel coupled to a second portion of the support structure. An electronic device can be coupled to a mounting surface of the circuit substrate and disposed within a space enclosed by walls of the support structure. The panel can include contiguous sections inner surfaces of which can be oriented within twenty-five degrees of parallel to said mounting surface. Each section can be significantly more thermally conductive generally parallel to the inner surface of the section than generally perpendicular to the inner surface.

21 Claims, 6 Drawing Sheets

PANEL FOR ENHANCING THERMAL CONDUCTION IN AN ELECTRONIC ASSEMBLY

BACKGROUND

Circuit board assemblies are known in which multiple electronic circuit elements are attached to a circuit board. A support structure, to which the circuit board is attached, is often included. The support structure can, for example, aid in sinking heat generated by the electronic circuit elements and enhance the physical stiffness of the circuit board. Embodiments of the present invention include a composite heat frame, which can comprise a panel attached to such a support structure. Such a heat frame can be configured to enhance conduction of heat and impart stiffness to the circuit board. This can lead to improvements in heat sinking and physical stiffness with respect to weight, which can allow for the use of larger circuit boards. Some embodiments of the present invention provide the foregoing and/or other improvements and advantages.

SUMMARY

In some embodiments of the invention, an electronic assembly can include a support structure, a circuit substrate to which an electronic device is attached, and a panel. The support structure can have walls that enclose a space, and the circuit substrate can be coupled to a first portion of the support structure. The electronic device can be attached to a mounting surface of the circuit substrate and disposed within the space. The panel can be coupled to a second portion of the support structure and can comprise contiguous sections. Each of the sections can have an inner surface that faces the mounting surface of the circuit substrate and is oriented within twenty-five degrees of parallel to the mounting surface. Each section can have a first thermal conductivity substantially parallel to the inner surface of the section and a second thermal conductivity substantially perpendicular to the inner surface of said section, and the first thermal conductivity can be greater than the second thermal conductivity.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "substantially" allows for insignificant, unintended deviations from perfection. The words "substantially planar" thus allow for insignificant, unintended deviations from perfect planarity. As used herein, "substantially parallel" means within ten degrees of parallel and "substantially perpendicular" means within ten degrees of perpendicular. The term "ones" means more than one.

Figure 1A:
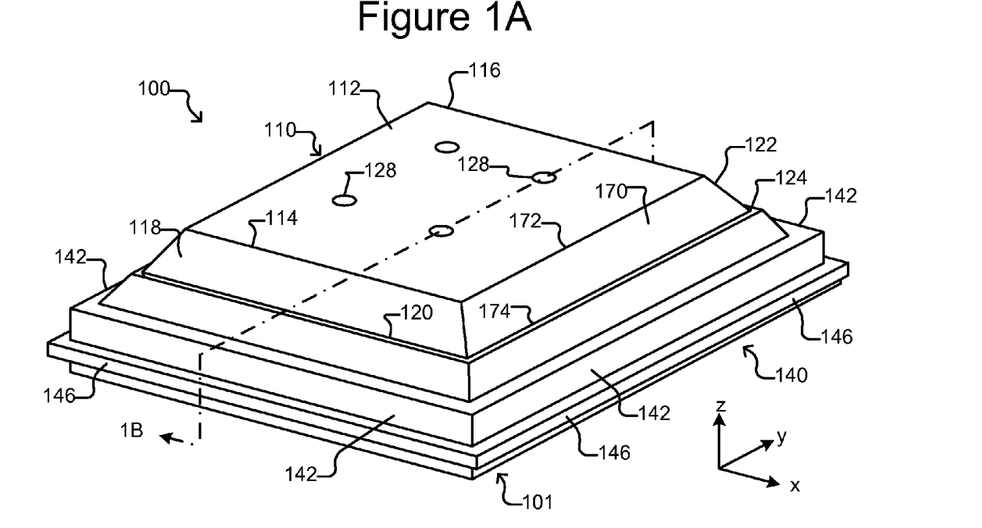
FIG. 1A illustrates a perspective view of an electronic assembly with a heat frame comprising a panel and a support structure and having superior heat conductive characteristics according to some embodiments of the invention.
Figure 1B:
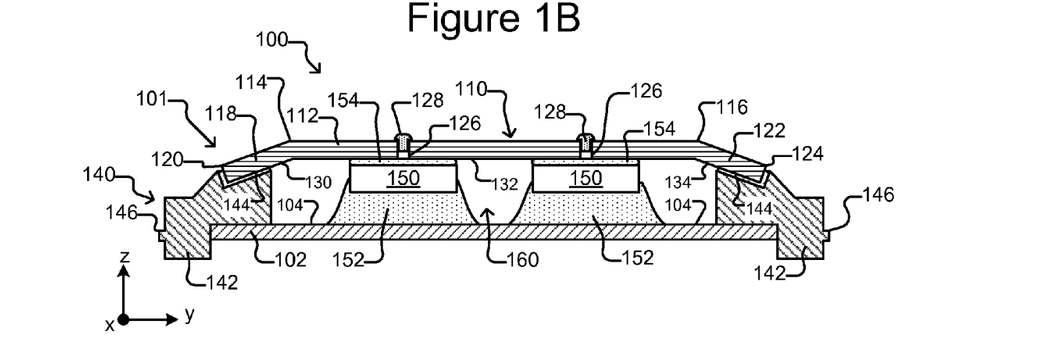
FIG. 1B is a cross sectional side view of the electronic assembly of FIG. 1A.

FIGS. 1A and 1B illustrate an example of an electronic apparatus 100 according to some embodiments of the invention. The electronic apparatus 100 can be, for example, a circuit card assembly. As shown, the electronic apparatus 100 can comprise a circuit substrate 102 and a composite heat frame 101, which can comprise a panel 110 and a support structure 140. As also shown, the circuit substrate 102 and the panel 110 can be coupled to the support structure 140. The heat frame 101 can provide physical stiffness and sink heat generated by electronic devices 150 attached to the circuit substrate 102. For example, the heat frame 101 can provide highly conductive thermal paths away from the electronic devices 150 and thus enhance heat sinking from the electronic devices 150. The heat frame 101 can also enhance physical stiffness.

As shown, the circuit substrate 102 can be a structure to which one or more electronic devices 150 are attached. For example, the circuit substrate 102 can comprise a mounting surface 104 to which the electronic devices 150 are attached. For example, the electronic devices 150 can be soldered, adhered, or otherwise attached to the mounting surface 104. Illustrated in FIGS. 1A and 1B is an adhesive material 152 adhering the electronic devices 150 to the mounting surface 104. In some embodiments, the mounting surface 104 can be substantially planar. Although not shown, the circuit substrate 102 can comprise internal and/or external electrical wiring (not shown), such as electrically conductive traces, vias, and/or the like, to which the electronic devices 150 are electrically connected. Non-limiting examples of the circuit substrate 102 include a printed circuit board, which can also be referred to as a circuit board or circuit card.

As shown in FIG. 1B, the circuit substrate 102 can be coupled to the support structure 140, which can comprise walls 142 that enclose and define an interior space 160 between the walls 142. As shown, the circuit substrate 102 can be coupled to the support structure 140 such that the electronic devices 150 attached to the circuit substrate 102 are in the interior space 160. For example, the circuit substrate 102 can be coupled to a first (e.g., lower) portion of the support structure 140 as shown in FIG. 1B. The circuit substrate 102 can be coupled to the support structure 140 in any suitable manner. For example, the circuit substrate 102 can be coupled to the support structure 140 by an adhesive material, screws, bolts, clamps, and/or the like (not shown).

The electronic devices 150 can be any type of electronic apparatus, component, circuit element, and/or the like. For example, one or more of the electronic devices 150 can be any of the following: a semiconductor die comprising one or more integrated electronic circuits, an electronic component (e.g., a resistors, capacitor, inductor, transistor or the like), a diode, or the like.

The support structure 140 can provide physical stiffness and can conduct heat away from the electronic devices 150. The support structure 140 can thus comprise a physically stiff material that has a relatively high thermal conductivity. In some embodiments, the support structure 140 can be made of a metal, for example, such as aluminum, copper, or the like. Moreover, the support structure 140 can include one or more coatings. For example, the support structure 140 can be coated with an anti-corrosion material such as nickel.

The support structure 140 can include features aid in the dissipation of heat. For example, the support structure 140 can comprise one or more heat radiating elements 146, which can comprise, for example, heat fins. Alternatively, an extension similar to element 146 can be a coupling structure that couples with corresponding coupling structure on another component or device (not shown) to facilitate coupling the electronic apparatus 100 to another device or apparatus.

Although illustrated as comprising four walls 142 surrounding the interior space 160, the support structure 140 can include additional features. For example, the support structure 140 can include isolation walls (not shown) that extend from one or more of the walls 142 into the interior space 160. Such isolation walls (not shown) can, for example, be disposed between ones of the electronic devices 150.

Figure 3:
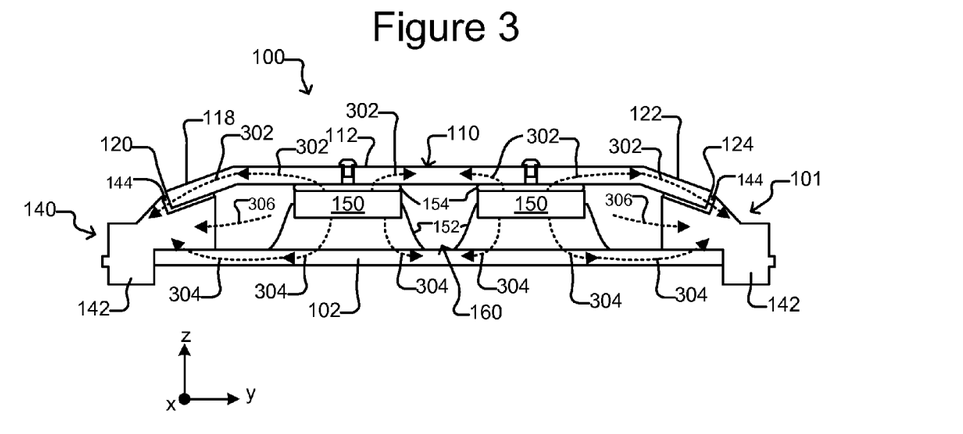
FIG. 3 illustrates with path flow arrows examples of heat conduction paths out of the electronic assembly of FIG. 1A.

The material of the support structure 140 can have a relatively high thermal conductivity. The support structure 140 can thus provide thermal paths that sink heat, such as heat generated by the electronic devices 150, from the interior space 160. With reference to FIG. 3, heat generated by the electronic devices 150 can thus be conducted by walls 142 of the support structure 140 from the interior space 160 and radiated by the support structure 140 outside of the electronic assembly 100. For example, the support structure 140 can radiate the heat into ambient air or, alternatively, into other components (not shown) outside of the support structure 140. Examples of such components (not shown) include a chassis (not shown), a liquid cooling apparatus (not shown), a conduction apparatus (not shown), a forced convection cooling apparatus (not shown), or the like. Such a thermal flow is depicted in FIG. 3 by thermal flow arrows 306. Heat from the electronic devices 150 can also heat the circuit substrate 102, and such heat can also be conducted by the walls 142 into the ambient air or other components (not shown) (e.g., a chassis (not shown), a liquid cooling conduction apparatus (not shown), a forced convection cooling apparatus (not shown), or the like) that are outside the support structure 140 generally as discussed above. Examples of such thermal flows are depicted by the thermal flow arrows 304 in FIG. 3.

As illustrated in FIGS. 1A and 1B, the panel 110 can be coupled to a second (e.g., upper) portion of the support structure 140 generally opposite the circuit substrate 102. For example, the support structure 140, the circuit substrate 102, and the panel 110 can bound (e.g., partially or fully enclose) the space 160. The panel 110 can be generally comparable to the circuit substrate 102 in size and overall form factor and can thus, with the support structure 140 and circuit substrate 102, form an enclosure comprising the interior space 160 for the electronic devices 150. The panel 110 can have high thermal conductivity and physical stiffness and can thus significantly enhance the thermal conductivity and stiffness characteristics of the support structure 140.

Figure 6:
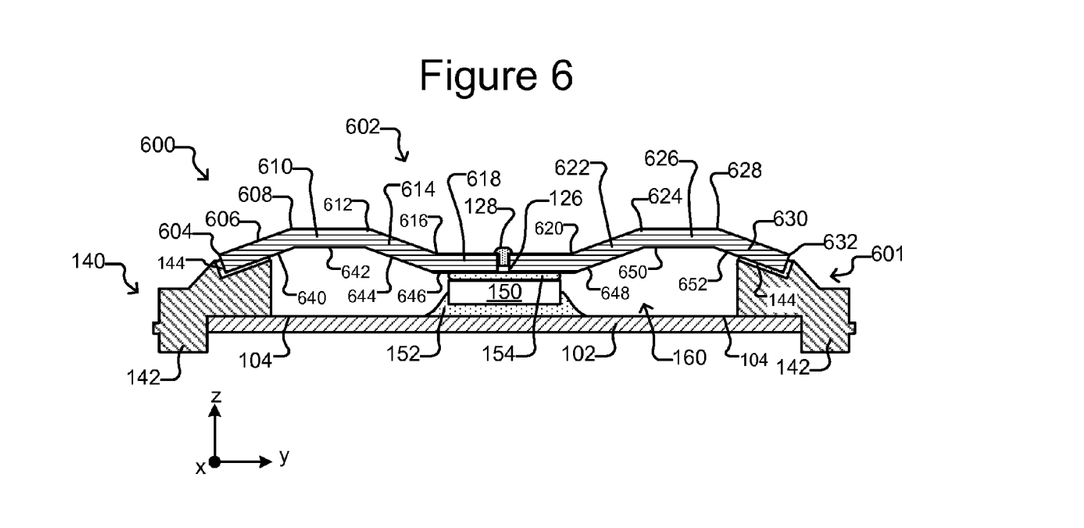
FIG. 6 illustrates another example of an electronic assembly with a composite material panel according to some embodiments of the invention.
Figure 8:
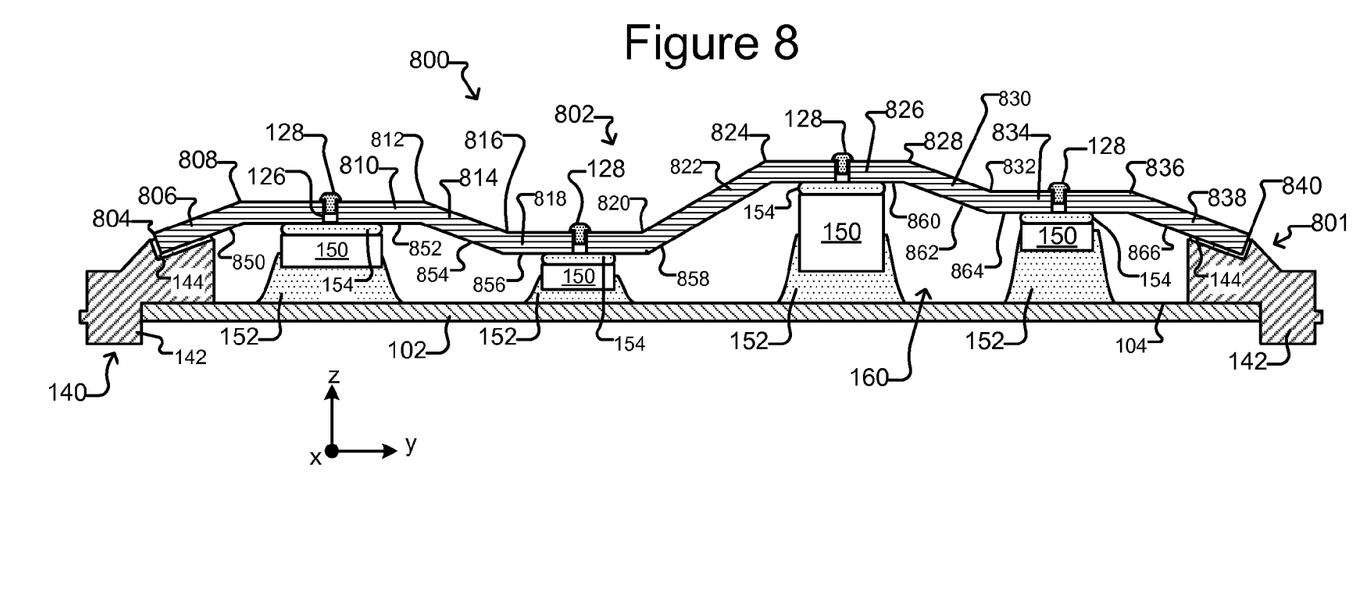
FIG. 8 illustrates another example of an electronic assembly with a composite material panel according to some embodiments of the invention.

As shown in FIGS. 1A and 1B, the panel 110 can comprise substantially parallel, contiguous sections 112, 118, 122 one or more of which can be angled with respect to each other and/or the mounting surface 104 of the circuit substrate 102. For ease of illustration and discussion, the panel 110 is illustrated in FIGS. 1A and 1B and discussed below with respect to three such sections 112, 118, 122 angled as shown in FIGS. 1A and 1B. The panel 110 can, however, have more or fewer than the three substantially parallel, contiguous sections 112, 118, 122 shown, and those sections can be oriented (e.g., angled) differently than shown. As will be further discussed below, FIGS. 6 and 8 illustrate additional examples of panels 602 and 802 that have different numbers of substantially parallel, contiguous sections which are oriented differently than the panel 110 illustrated in FIGS. 1A and 1B. Even so, all of the panels 110, 602, 802 are examples only, and the invention is not limited to use of a panel with any particular number of sections or orientation of sections. Generally as illustrated by section 170, the panel 110 can also include other sections, which may not be substantially parallel with one or more of the other sections.

With reference now to FIGS. 1A and 1B, as shown, the panel 110 can comprise sections 112, 118, 122, which can be contiguous. In some embodiments, sections 112, 118, 122 can be bounded by boundaries 114, 116, 120, 124. Because sections 112, 118, 122 can be contiguous, pairs of contiguous sections 112, 118, 122 can share a common boundary 114, 116, 120, 124. For example, as illustrated in FIGS. 1A and 1B, boundary 114 is common to contiguous sections 112 and 118, and boundary 116 is common to contiguous sections 112 and 122. As also shown in FIGS. 1A and 1B, in some embodiments, the boundaries 114, 116, 120, 124 can correspond generally to straight lines that can be substantially parallel. In other embodiments, however, the boundaries 114, 116, 120, 124 do not correspond to straight lines and need not be substantially parallel. Moreover, as noted above, the panel 110 can have other sections 170 that may not be substantially parallel with other sections, and those sections (e.g., section 170) can include boundaries 172, 174 that are not substantially parallel with the boundaries 114, 116, 120, 124. Such sections 170 can, however, by otherwise configured and have any of the same characteristics of the sections 112, 118, 122 discussed herein.

As also illustrated in FIGS. 1A and 1B, each section 112, 118, 122 can have an inner surface 130, 132, 134 that faces the mounting surface 104 of the circuit substrate 102. As used herein, "faces" the mounting surface 104 means that an inner surface 130, 132, 134 is directed generally towards rather than away from the mounting surface 104. In some embodiments, the inner surface 130, 132, 134 of each section 112, 118, 122 can extend between the boundaries 114, 116, 120, 124 of the section 112, 118, 122. For example, the inner surface 130 of section 118 can extend from an outer boundary 120 to the common boundary 114, the inner surface 132 of section 112 can extend from the common boundary 114 to the common boundary 116, and the inner surface 134 of section 122 can extend from the common boundary 116 to the outer boundary 124. As shown, in some embodiments, the inner surfaces 130, 132, 134 can be substantially planar.

Figure 2:
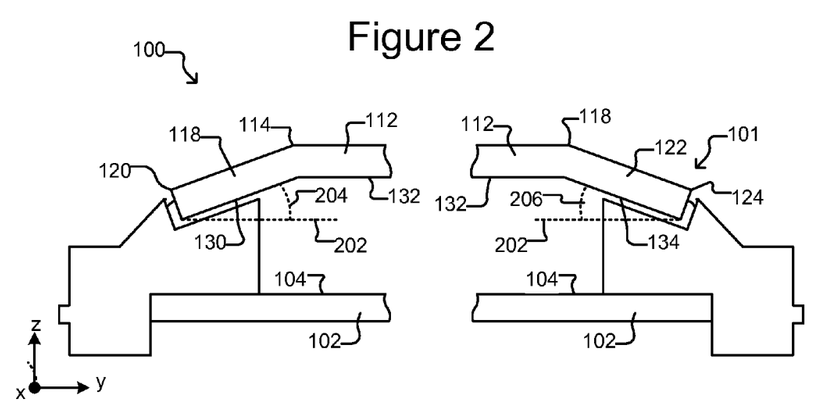
FIG. 2 illustrates examples of angles between some of the sections of the panel and a plane that is substantially parallel to the mounting surface of a circuit substrate of the electronic assembly of FIG. 1A or another of the sections according to some embodiments of the invention.

Generally as illustrated in FIG. 1B, one or more of sections 112, 118, 122 can be angled with respect to each other and/or the mounting surface 104 of the circuit substrate 102. For example, as shown in FIG. 2, sections 118 and 122 can be angled with respect to section 112. For example, there can be an angle 204 between an axis or plane 202 that is parallel to the mounting surface 104 of the circuit substrate 102 and/or the inner surface 132 of section 112. As also illustrated in FIG. 2, there can be an angle 206 between the axis or plane 202 and/or the inner surface 132. In some embodiments, the angles 204 and 206 can be less than or equal to forty-five degrees, thirty degrees, twenty-five degrees, fifteen degrees, ten degrees, or five degrees. Put another way, in various embodiments, the angles 204 and 206 can be greater than zero but less than or equal to forty-five degrees, thirty degrees, twenty-five degrees, fifteen degrees, ten degrees, or five degrees. In fact, all of the inner surfaces 130, 132, 134 of the all of sections 112, 118, 122 of the panel 110 can be with forty-five degrees, thirty degrees, twenty-five degrees, fifteen degrees, ten degree, or five degrees of parallel to each other and/or the mounting surface 104 of the circuit substrate 102.

The panel 110 can comprise a composite material. As used herein, "composite material" means a combination of two or more distinct and different materials. Moreover, the composite material of the panel 110 can be configured such that thermal conductivity can differ in different directions in the panel 110. For example, each section 112, 118, 122 can be configured so that the thermal conductivity is significantly greater in a first direction that is substantially parallel to the inner surface 130, 132, 134 of the section 112, 118, 122 than in a second direction that is substantially perpendicular to the inner surface 130, 132, 134. For example, section 118 can have a first thermal conductivity in a direction that is substantially parallel to the inner surface 130 and a second thermal conductivity in a direction that is substantially perpendicular to the inner surface 130, and the first thermal conductivity can be significantly greater (e.g., two times or more, five times or more, fifty times or more, one-hundred times or more, or five hundred times or more) than the second thermal conductivity of section 118. Put another way, the thermal conductivity of section 118 can be significantly greater (e.g., as much as five hundred times or more in some embodiments) in the plane of the inner surface 130 than perpendicular to the inner surface 130. The panel 110 can also include one or more coatings such as an anti-corrosion coating, an electrically conductive coating that can function as an electromagnetic shield, or the like.

Similarly, section 112 can have a first thermal conductivity in a direction that is substantially parallel to the inner surface 132 and a second thermal conductivity in a direction that is substantially perpendicular to the inner surface 132, and the first thermal conductivity can be significantly greater (e.g., two times or more, five times or more, fifty times or more, one-hundred times or more, of five hundred times or more) than the second thermal conductivity of section 112. Likewise, section 122 can have a first thermal conductivity in a direction that is substantially parallel to the inner surface 134 and a second thermal conductivity in a direction that is substantially perpendicular to the inner surface 134, and the first thermal conductivity can be significantly greater (e.g., as much as five hundred times or more) than the second thermal conductivity of section 122. The thermal conductivity of section 112 can thus be significantly greater (e.g., in some embodiments, five hundred times or more) in the plane of the inner surface 132 than perpendicular to the inner surface 132, and the thermal conductivity of section 122 can likewise be significantly greater in the plane of the inner surface 134 than perpendicular to the inner surface 134.

The panel 110 can thus be configured to provide highly conductive thermal paths that are substantially parallel with the inner surfaces 130, 132, 134 of the sections 112, 118, 122. For example, as illustrated in FIG. 3, the panel 110 can provide highly conductive thermal paths as illustrated by flow arrows 302 from the electronic devices 150 into section 112 and then through the outer sections 118 and 122 to the support structure 140. As shown in FIG. 1B, a fill material 154 can be disposed between and physically contact the electronic devices 150 and the inner surface 132 of section 112. The fill material 154 can be a thermally conductive material that can thus readily conduct heat from the electronic devices 150 into section 112 of the panel 110. Similarly, the panel 110 can be coupled to the support structure 140 by a thermally conductive adhesive 144 to enhance conduction of the heat from the ends of the panel 110 corresponding to boundaries 120, 124 to the support structure 140.

Heat from the electronic devices 150 can thus readily flow from the electronic devices 150 through the fill material 154 into section 112 of the panel 110. Due to the high conductivity in each section 112, 118, 122 substantially parallel to the inner surfaces 130, 132, 134, the heat can readily flow as illustrated by flow arrows 302 through section 112 generally parallel to the inner surface 132 of section 112 into either of the outer sections 118, 122 and out the ends of sections 118, 122 that correspond to the outer boundaries 120, 124 into the support structure 140. As discussed above, the support structure 140 can radiate the heat into the surrounding ambient air or into other components (not shown) (e.g., a chassis (not shown), a liquid cooling apparatus (not shown), a conduction apparatus (not shown), a forced convection cooling apparatus (not shown), or the like) that are outside the support structure 140 generally as discussed above.

The panel 110 can thus provide thermal paths depicted by arrows 302 from the electronic devices 150 that are in addition to the thermal paths depicted by arrows 304 and 306 in FIG. 3, which were discussed above. In fact, a thermal path corresponding to the flow arrows 302 in FIG. 3 from inside the electronic assembly 100 (e.g., from an electronic device 150) to outside the electronic assembly can have a greater thermal conductivity than any other thermal path from the space 160 inside the electronic assembly 100 to outside of the electronic assembly 100 including the thermal paths depicted by arrows 304, 306 in FIG. 3.

Figure 4:
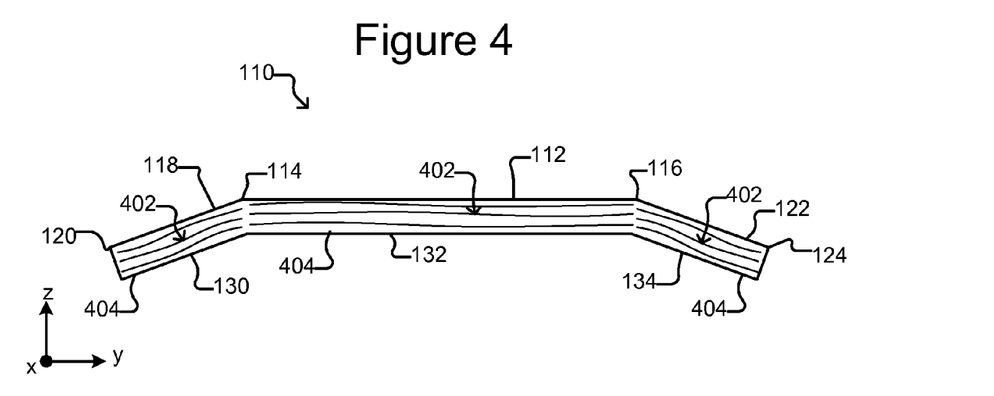
FIG. 4 illustrates an example in which the sections of the panel each comprise elongated fibers disposed in an encasing material according to some embodiments of the invention.

As noted, the panel 110 can comprise a composite material. FIG. 4 illustrates an example in which each section 112, 118, 122 is made of a composite material that comprises elongated fibers 402 embedded in an encasing material 404. Moreover, the elongated fibers 402 in each section 112, 118, 122 can be oriented substantially parallel to the inner surface 130, 132, 34 of the section. For example, the elongated fibers 402 embedded in the encasing material 404 of section 118 can be oriented substantially parallel to the inner surface 130. Similarly, the elongated fibers 402 embedded in the encasing material 404 of section 112 can be oriented substantially parallel to the inner surface 132, and the elongated fibers 402 embedded in the encasing material 404 of section 122 can be oriented substantially parallel to the inner surface 134. The fibers 402 can be significantly thermally conductive along their elongated lengths, which can thus make each section 112, 118, 122 significantly more conductive in a direction that is substantially parallel to the inner surfaces 130, 132, 134 of sections 112, 118, 122 than a direction that is substantially perpendicular to the inner surfaces 130, 132, 134 as discussed above.

In some embodiments, the elongated fibers 402 in a section 112, 118, 122 can be further oriented to extend generally from one boundary 114, 118, 120, 124 to the other boundary of section. For example, the elongated fibers 402 embedded in the encasing material 404 of section 118 can extend generally from the boundary 120 to the boundary 114 of section 118. Similarly, the elongated fibers 402 embedded in the encasing material 404 of section 112 can extend generally from the boundary 114 to the boundary 116 of section 112, and the elongated fibers 402 embedded in the encasing material 404 of section 122 can extend generally from the boundary 116 to the boundary 124 of section 122.

The foregoing, however, is merely an example. In some embodiments, one or more (e.g., all) of sections 112, 118, 122 can comprise a quasi-isotropic layup of layers of the fibers 402 in which the elongated lengths of the fibers 402 in all of the layers are substantially parallel to the inner surface 130, 132, 134 but the fibers 402 in one layer are oriented in different directions than the fibers 402 in another of the layers.

Figure 5:
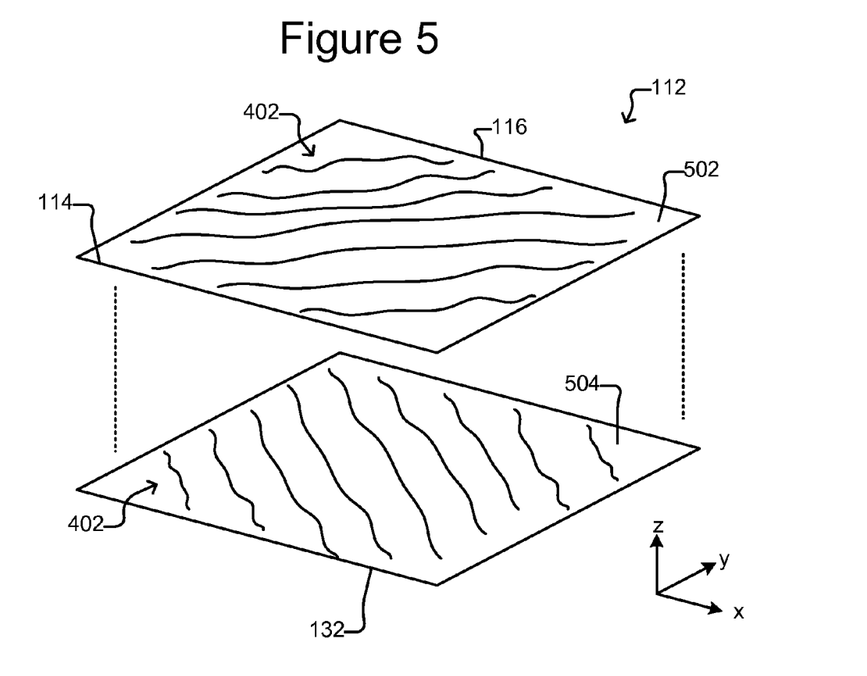
FIG. 5 shows an example in which one of the sections of the panel comprises layers laminated together according to some embodiments of the invention.

An example is illustrated in FIG. 5, which shows an exploded view of section 112 comprising a layer 502 in which the elongated lengths of the fibers 402 are oriented in a first direction that is substantially parallel to the inner surface 132 and a second layer 504 in which the elongated lengths of the fibers 402 are oriented in a different direction that is also substantially parallel to the inner surface 132. Section 112 can comprise two or more of such layers 502, 504 stacked one on top of the other and laminated together. The other sections 118, 122 can similarly comprise a plurality of stacked, laminated layers such as layers 502, 504 as shown in FIG. 5.

The fibers 402 can be any type of fiber that conducts heat along its elongated length. For example, the fibers 402 can be metal fibers. As another example, the fibers 402 can be carbon fibers. Examples of such carbon fibers include vapor grown carbon fibers, carbon nanotubes, or the like. As yet another example, the fibers 402 can be graphic fibers.

The encasing material 404 can be any material for holding the fibers 402 in place. For example, the encasing material 404 can be a matrix material. Examples of such matrix materials include polymeric, metallic, and ceramic matrixes. Epoxies, polyamides, resins, aluminum, titanium, and alumina are also suitable examples of encasing material 404.

As shown in FIG. 1B, there can be holes 126 in the panel 110 above the electronic devices 150. The fill material 154 can be provided through the holes 126 onto the electronic devices 150. Plugs 128 can thereafter plug the holes 126.

Alternatively, the plugs 128 can be attached (e.g., with an adhesive such as an epoxy) to the panel 110, and the holes 126 can be drilled through the plugs 128 and the panel 110. The fill material 154 can then be provided through the holes 126 onto the electronic devices 150. Such plugs 128 can seal holes 126 and improve thermal conductivity from the electronic devices 150 to the panel 110.

Regardless, the fill material 154 can physically contact both the electronic devices 150 and the inner surface 132 of section 112. A noted, the fill material 154 can be thermally conductive and can thus provide high conductivity thermal paths from the electronic devices 150 to the inner surface 132 of section 112 and thus the panel 110.

As mentioned, the panel 110 can comprise more or fewer than the three substantially parallel sections 112, 118, 122, and FIGS. 6 and 8 illustrates examples of panels 602 and 802 each of which has a different number and orientation of such sections. Other than a different number and configuration of sections and electronic devices 150, however, the electronic assemblies 600 and 800 of FIGS. 6 and 8 can be the same as the electronic assembly 100 illustrated in FIGS. 1A and 1B as discussed above. In FIGS. 1A, 1B, 6, and 8, like number elements are the same, and like numbered elements in FIGS. 6 and 8 thus have the same properties and characteristics as discussed above with regard to electronic assembly 100.

FIG. 6 illustrates an electronic apparatus 600 that can be the same as the electronic apparatus 100 but has a heat frame 601 rather than the heat frame 101. As shown, the heat frame 601 can comprise the support structure 140 and an attached panel 602 rather than the panel 110. As illustrated in FIG. 6, the panel 602 can comprise sections 606, 610, 614, 618, 622, 626, 630, which can be generally the same as any of sections 112, 118, 122 of the panel 110. For example, each section 606, 610, 614, 618, 622, 626, 630 can comprise an inner surface 640, 642, 644, 646, 648, 650, 652, and each section 606, 610, 614, 618, 622, 626, 630 can be bounded by boundaries 604, 608, 612, 616, 620, 624, 628, 632. Each section 606, 610, 614, 618, 622, 626, 630 can be configured like, comprise the same material as, and have the same characteristics and properties as any of sections 112, 118, 122 discussed above.

Figure 7:
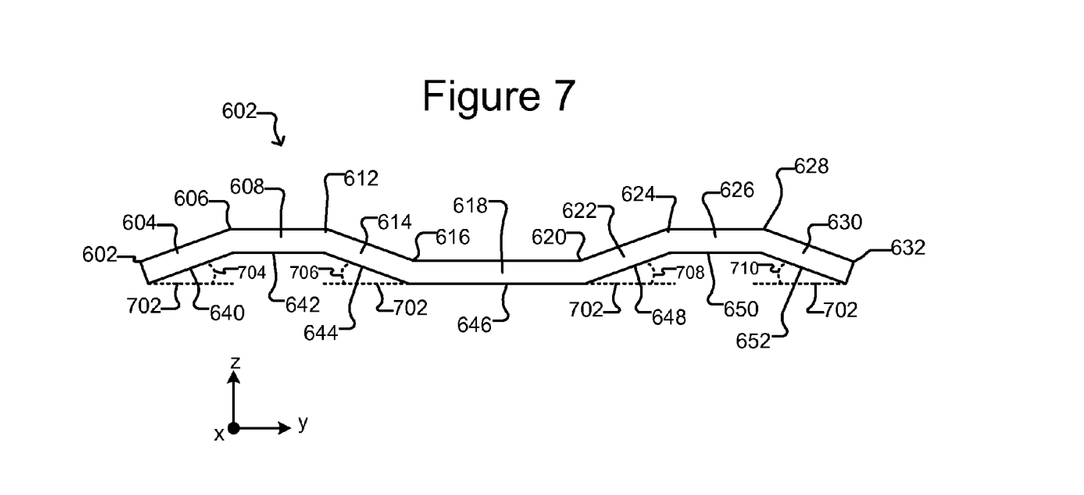
FIG. 7 illustrates examples of angles between some of the sections of the panel and a plane that is substantially parallel to the mounting surface of a circuit substrate of the electronic assembly of FIG. 6 or another of the sections according to some embodiments of the invention.

As shown in FIGS. 6 and 7, section 618 can be oriented such that its inner surface 646 is substantially parallel with the mounting surface 104 of the circuit substrate 102, and the inner sections 642 and 650 of sections 610 and 626 can also be substantially parallel with the mounting surface 104. As illustrated in FIG. 7, sections 604, 614, 622, 630 can be angled with respect to sections 608, 618, 626. For example, there can be an angle 704 between an axis or plane 702 that is parallel with the mounting surface 104 of the circuit substrate 102 and/or the inner surface 646 of section 618 and the inner surface 640 of section 604. As also shown, there can be an angle 706 between the axis or plane 702 and the inner surface 644 of section 614. There can similarly be an angle 708 between the axis or plane 702 and the inner surface 648 of section 622, and there can likewise be an angle 710 between the axis or plane 702 and the inner surface 652 of section 630.

In some embodiments, the angles 704, 706, 708, 710 can be less than or equal to forty-five degrees, thirty degrees, twenty-five degrees, fifteen degrees, ten degrees, or five degrees. Put another way, in various embodiments, the angles 704, 706, 708, 710 can be greater than zero degrees by but less than or equal to forty-five degrees, thirty degrees, twenty-five degrees, fifteen degrees, ten degrees, or five degrees. In fact, all of the inner surfaces 640, 642, 644, 646, 648, 650, 652 of all of the sections 604, 608, 614, 618, 622, 626, 630 can be within forty-five degrees, thirty degrees, twenty-five degrees, fifteen degrees, ten degree, or five degrees of parallel with each other and/or the mounting surface 104 of the circuit substrate 102.

As illustrated in FIG. 6, the distance between the mounting surface 104 of the circuit substrate 102 and the inner surface 642 of section 610 and/or the inner surface 650 of section 626 can be greater than the distance between the mounting surface 104 and the inner surface 646 of section 618. Moreover, the resulting downward orientation of sections 614 and 622 with respect to section 618 can, in some embodiments, create a downward force on the electronic device 150 that can keep the electronic device 150 in place, reduce contact resistance between leads of the electronic devices 150 and the circuit substrate 102, or the like.

FIG. 8 illustrates an electronic apparatus 800 that can be the same as the electronic apparatus 100 but can comprise a heat frame 801 rather than the heat frame 101. As shown, the heat frame 801 can comprise the support structure 140 and an attached panel 802 rather than the panel 110. The panel 802 can comprise sections 806, 810, 814, 818, 822, 826, 830, 834, 838, which can be generally the same as any of sections 112, 118, 122 of the panel 110. For example, each section 806, 810, 814, 818, 822, 826, 830, 834, 838 can comprise an inner surface 850, 852, 854, 856, 858, 860, 862, 864, 866, and each section 806, 810, 814, 818, 822, 826, 830, 834, 838 can be bounded by boundaries 804, 808, 812, 816, 820, 824, 828, 832, 836, 840. Each section 806, 810, 814, 818, 822, 826, 830, 834, 838 can be configured like, comprise the same material as, and have the same characteristics and properties as any of sections 112, 118, 122 discussed above.

Figure 9:
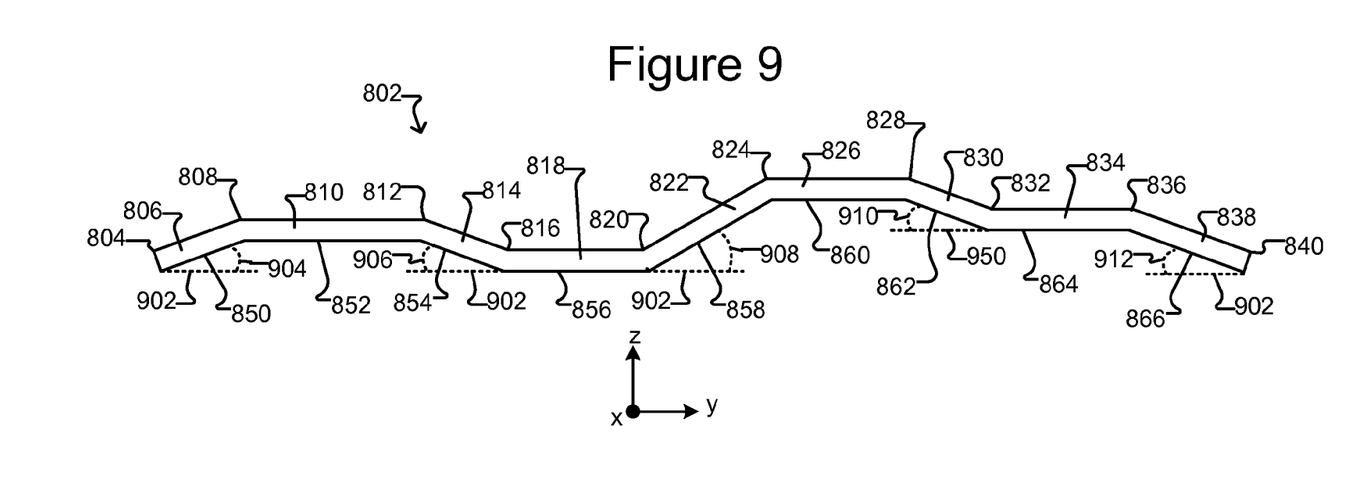
FIG. 9 illustrates examples of angles between some of the sections of the panel and a plane that is substantially parallel to the mounting surface of a circuit substrate of the electronic assembly of FIG. 8 or another of the sections according to some embodiments of the invention.

As shown in FIGS. 8 and 9, sections 810, 818, 826, 834 can be oriented such that their inner surfaces 852, 856, 860, 864 are substantially parallel with the mounting surface 104 of the circuit substrate 102. As illustrated in FIG. 9, sections 806, 814, 822, 830, 838 can be angled with respect to sections 810, 818, 826, 834. For example, there can be an angle 904 between an axis or plane 902 that is parallel with the mounting surface 104 of the circuit substrate 102 and/or the inner surfaces 852, 856, 860, 864 of sections 810, 818, 826, 834. As also shown, there can be an angle 906 between the axis or plane 902 and the inner surface 854 of section 814. There can similarly be an angle 908 between the axis or plane 902 and the inner surface 858 of section 822, and there can likewise be an angle 912 between the axis or plane 902 and the inner surface 866 of section 838. There can also be an angle 910 between an axis or plane 950 and the inner surface 862 of section 830. The axis or plane 950 can be parallel to the axis or plane 902.

In some embodiments, the angles 904, 906, 908, 910, 912 can be less than or equal to forty-five degrees, thirty degrees, twenty-five degrees, fifteen degrees, ten degrees, or five degrees. Put another way, in various embodiments, the angles 904, 906, 908, 910, 912 can be greater than zero degrees by but less than or equal to forty-five degrees, thirty degrees, twenty-five degrees, fifteen degrees, ten degrees, or five degrees. In fact, all of the inner surfaces 850, 852, 854, 856, 858, 860, 862, 864, 866 of all the sections 806, 810, 814, 818, 822, 826, 830, 834, 838 of the panel 802 can be within forty-five degrees, thirty degrees, twenty-five degrees, fifteen degrees, ten degree, or five degrees of parallel with each other and/or the mounting surface 104 of the circuit substrate 102.

As illustrated in FIG. 8, the distances between the mounting surface 104 of the circuit substrate 102 and two or more of the inner surfaces 852, 856, 860, 864 can be different. The panel 802 can thus be customized to different sized electronic devices 150 as shown in FIG. 8.

Figure 10:
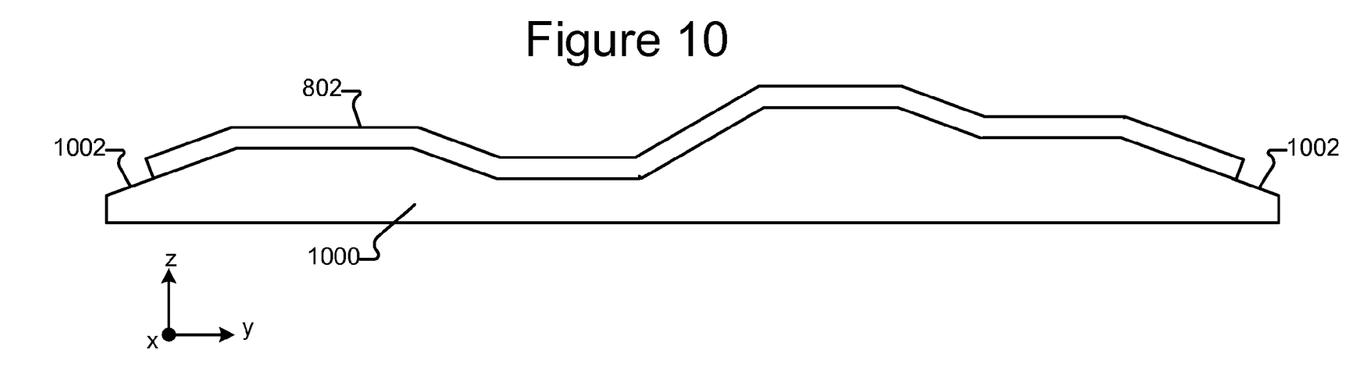
FIG. 10 shows an example of a mold plate with a patterned surface on which composite material panels can be formed according to some embodiments of the invention.

Panels 110, 602, 802 can be readily manufactured. For example, as shown in FIG. 10, the panel 802 can be manufactured on a patterned surface 1002 of a mold plate 1000. The patterned surface 1002 can be in the desired shape of the panel 802. A panel 802 can be formed on the patterned surface 1002. The panels 110, 602 can also be made on a pattern surface like surface 1002 but that is patterned in the desired shape of panel 110 or panel 602.

Although specific embodiments and applications of the invention have been described in this specification, these embodiments and applications are exemplary only, and many variations are possible. For example, there can be one or more additional support structures included in any of the electronic apparatuses 100, 600, 800. For example, there can be a second support structure (not shown) disposed above the support structure 140 with the panel 110, 602, 802 between the second support structure (not shown) and the support structure 140 in any of the electronic devices 100, 600, 800.

I claim:

1. An electronic assembly comprising:
    a support structure comprising walls enclosing a space;
    a circuit substrate coupled to a first portion of said support structure, said circuit substrate comprising a mounting surface;
    an electronic device attached to said mounting surface and disposed within said space; and
    a panel coupled to a second portion of said support structure, said panel comprising contiguous sections, each said section comprising a substantially planar inner surface facing said mounting surface of said circuit substrate and oriented within twenty-five degrees of parallel to said mounting surface,
    wherein each said section has a first thermal conductivity substantially parallel to the inner surface of said section and a second thermal conductivity substantially perpendicular to the inner surface of said section,
    wherein said first thermal conductivity is greater than said second thermal conductivity,
    wherein an angle between said inner surface of a first one of said sections and a plane parallel to said inner surface of a second one of said sections is between five degrees and forty-five degrees inclusive, and
    wherein said second one of said sections is contiguous with said first one of said sections.

2. The electronic assembly of claim 1, wherein for each said section, said first thermal conductivity is at least five times greater than said second thermal conductivity.

3. An electronic assembly comprising:
    a support structure comprising walls enclosing a space;
    a circuit substrate coupled to a first portion of said support structure, said circuit substrate comprising a mounting surface;
    an electronic device attached to said mounting surface and disposed within said space; and
    a panel coupled to a second portion of said support structure, said panel comprising contiguous sections, each said section comprising an inner surface facing said mounting surface of said circuit substrate and oriented within twenty-five degrees of parallel to said mounting surface,
    wherein each said section has a first thermal conductivity substantially parallel to the inner surface of said section and a second thermal conductivity substantially perpendicular to the inner surface of said section, wherein for each said section, said first thermal conductivity is at least one-hundred times greater than said second thermal conductivity.

4. The electronic assembly of claim 2, wherein:
said panel further comprises substantially parallel edges bounding said sections, and
for each said section, said inner surface of said section is from one of said edges bounding said section to another of said edges bounding said section.

5. The electronic assembly of claim 4, wherein said mounting surface is substantially planar.

6. The electronic assembly of claim 5 further comprising thermally conductive material disposed between and physically contacting said electronic device and the inner surface of said first one of said sections of said panel.

7. The electronic assembly of claim 6, wherein said inner surface of said first one of said sections is substantially parallel to said mounting surface.

8. An electronic assembly comprising:
a support structure comprising walls enclosing a space;
a circuit substrate coupled to a first portion of said support structure, said circuit substrate comprising a mounting surface;
an electronic device attached to said mounting surface and disposed within said space; and
a panel coupled to a second portion of said support structure, said panel comprising contiguous sections, each said section comprising an inner surface facing said mounting surface of said circuit substrate and oriented within twenty-five degrees of parallel to said mounting surface,
wherein each said section has a first thermal conductivity substantially parallel to the inner surface of said section and a second thermal conductivity substantially perpendicular to the inner surface of said section,
wherein said first thermal conductivity is greater than said second thermal conductivity, and
wherein:
the inner surface of a first one of said sections is substantially parallel to said mounting surface of said circuit substrate,
the inner surface of a second one of said sections is not substantially parallel to said mounting surface of said circuit substrate,
the inner surface of a third one of said sections is substantially parallel to said mounting surface of said circuit substrate, and
a distance perpendicular to said inner surface of said third one of said sections between said inner surface of said third one of said sections and said mounting surface of said circuit substrate is greater than a distance perpendicular to said inner surface of said first one of said sections between said inner surface of said first one of said sections and said mounting surface.

9. An electronic assembly comprising:
a support structure comprising walls enclosing a space;
a circuit substrate coupled to a first portion of said support structure, said circuit substrate comprising a mounting surface;
an electronic device attached to said mounting surface and disposed within said space;
a panel coupled to a second portion of said support structure, said panel comprising contiguous sections, each said section comprising an inner surface facing said mounting surface of said circuit substrate and oriented within twenty-five degrees of parallel to said mounting surface; and
thermally conductive material disposed between and physically contacting said electronic device and the inner surface of one of said sections of said panel,
wherein each said section has a first thermal conductivity substantially parallel to the inner surface of said section and a second thermal conductivity substantially perpendicular to the inner surface of said section,
wherein said first thermal conductivity is greater than said second thermal conductivity,
wherein for each said section, said first thermal conductivity is at least five times greater than said second thermal conductivity,
wherein said panel further comprises substantially parallel edges bounding said sections, and for each said section, said the inner surface of said section is from one of said edges bounding said section to another of said edges bounding said section,
wherein said mounting surface is substantially planar, and each of the inner surfaces of said sections of said panel are substantially planar,
wherein said inner surface of said one of said sections is substantially parallel to said mounting surface,
wherein the inner surface of a second one of said sections is substantially parallel to said mounting surface of said circuit substrate, and a distance between said inner surface of said second one of said sections and said mounting surface of said circuit substrate is greater than a distance between said inner surface of said one of said sections and said mounting surface, and
wherein:
an angle between the inner surface of a third one of said sections and a plane parallel to said inner surface of said second one of said sections is greater than zero but less than twenty-five degrees, and
said third one of said sections is contiguous with said one of said sections and said second one of said sections.

10. The electronic assembly of claim 9 further comprising:
a second electronic device coupled to said mounting surface of said circuit substrate; and
thermally conductive material disposed between and physically contacting said second electronic device and said inner surface of said second one of said sections of said panel.

11. The electronic assembly of claim 2, wherein each of said inner surfaces of said sections of said panel are oriented within twenty five degrees of parallel to every other one of said inner surfaces of said sections.

12. The electronic assembly of claim 2, wherein each said section of said panel comprises elongated fibers.

13. The electronic assembly of claim 12, wherein for each said section of said panel, said elongated fibers of said section are substantially parallel to the inner surface of said section.

14. The electronic assembly of claim 13, wherein a thermally conductive path from said space enclosed by said walls of said support structure out of said electronic assembly that has a greatest thermal conductivity comprises a thermal path through contiguous ones of said sections of said panel to an outer edge of an outer one of said sections of said panel.

15. An electronic assembly comprising:
a support structure comprising walls enclosing a space;
a circuit substrate coupled to a first portion of said support structure, said circuit substrate comprising a mounting surface;
an electronic device attached to said mounting surface and disposed within said space; and
a panel coupled to a second portion of said support structure, said panel comprising contiguous sections, each said section comprising an inner surface facing said mounting surface of said circuit substrate and oriented within twenty-five degrees of parallel to said mounting surface, wherein each said section has a first thermal conductivity substantially parallel to the inner surface of said section and a second thermal conductivity substantially perpendicular to the inner surface of said section, wherein said first thermal conductivity is greater than said second thermal conductivity, wherein a thermally conductive path from said space enclosed by said walls of said support structure out of said electronic assembly that has a greatest thermal conductivity comprises a thermal path through contiguous ones of said sections of said panel to an outer edge of an outer one of said sections of said panel, and wherein said electronic assembly further comprises a thermally conductive adhesive coupling said outer edge of said outer one of said sections to said support structure.

16. The electronic assembly of claim 15 further comprising a thermally conductive material disposed between and in physical contact with said electronic device and the inner surface of one of said contiguous ones of said sections of said panel.

17. The electronic assembly of claim 12, wherein said elongated fibers are carbon fibers.

18. The electronic assembly of claim 17, wherein said elongated fibers are vapor grown carbon fibers.

19. The electronic assembly of claim 12, wherein said panel comprises a matrix material and said elongated fibers disposed in said matrix material.

20. The electronic assembly of claim 1, wherein said first one of said sections comprises:
- a plurality of stacked layers each substantially parallel to said inner surface of said first one of said sections,
- a first of said layers comprises elongated fibers oriented in a first direction,
- a second of said layers comprises elongated fibers oriented in a second direction, and
- said first direction is different than said second direction.

21. The electronic assembly of claim 20, wherein:
said first direction is substantially perpendicular to said second direction, and
said first direction and said second direction are substantially parallel to said inner surface of said first one of said sections.

* * * * *